United States Patent [19]

Nose et al.

[11] Patent Number: 4,802,136
[45] Date of Patent: Jan. 31, 1989

[54] DATA DELAY/MEMORY CIRCUIT

[75] Inventors: Sigeru Nose, Sagamihara; Seigo Suzuki, Tokyo, both of Japan

[73] Assignee: Kabushiki Kaisha Toshiba, Kawasaki, Japan

[21] Appl. No.: 188,672

[22] Filed: Apr. 29, 1988

Related U.S. Application Data

[63] Continuation of Ser. No. 761,708, Aug. 2, 1985, abandoned.

[30] Foreign Application Priority Data

Aug. 7, 1984 [JP] Japan .................................. 59-165132

[51] Int. Cl.$^4$ .......................... G11C 8/00; G11C 7/00; G11C 19/00
[52] U.S. Cl. ......................................... 365/238; 377/79; 365/194; 365/78
[58] Field of Search ............... 365/194, 233, 240, 238, 365/75, 76, 73, 78, 51, 63, 221; 377/78, 79, 77; 307/582

[56] References Cited

U.S. PATENT DOCUMENTS

| | | | |
|---|---|---|---|
| 3,369,226 | 2/1968 | Reach, Jr. ..................... | 365/93 |
| 3,648,066 | 3/1972 | Terman ........................ | 377/79 |
| 3,763,480 | 10/1973 | Weimer ........................ | 365/238 |
| 3,914,750 | 10/1975 | Hadden, Jr. .................. | 365/240 |
| 3,953,837 | 4/1976 | Cheek, Jr. .................... | 365/238 |
| 4,034,301 | 7/1977 | Kaslio ......................... | 377/79 |
| 4,092,734 | 5/1978 | Collins et al. ................ | 365/238 |
| 4,272,831 | 6/1981 | Ullrich ........................ | 365/238 |
| 4,306,160 | 12/1981 | Hamilton ..................... | 307/221 D X |
| 4,353,057 | 10/1982 | Bernet et al. ................ | 328/151 |
| 4,613,773 | 9/1986 | Koike .......................... | 377/79 |

FOREIGN PATENT DOCUMENTS

| | | | |
|---|---|---|---|
| 55-129912 | 10/1980 | Japan .......................... | 361/194 |
| 59-63093 | 4/1984 | Japan .......................... | 365/194 |
| 0607697 | 1/1985 | Japan .......................... | 377/79 |

OTHER PUBLICATIONS

IBM Technical Disclosure Bulletin, vol. 12, No. 12, May 1970, pp. 2144–2145, "Complementary FET Shift Register Using a Single Phase Line", by Gaemssler.

The Electronic Engineer, Mar. 1970, pp. 59–61, "MOS Shift Registers", by George Landers.

Patent Abstracts of Japan, vol. 8, No. 248 (P-313) [1685], Nov. 14, 1984 concerning Japanese Patent Document No. 59-119594 (Kimura).

Primary Examiner—Stuart N. Hecker
Assistant Examiner—Alfonso Garcia
Attorney, Agent, or Firm—Finnegan, Henderson, Farabow, Garrett, & Dunner

[57] ABSTRACT

A data delay/memory circuit includes clock-controlled data latch circuits formed with cascade-connected clocked inverters. The data delay/memory circuit also includes a clock generator for supplying the clocked inverters with clock signals. These clock signals have individual clocking phases and are sequentially generated such that the clocking phase for a final stage of the data latch circuits is ahead of that for an initial stage thereof.

5 Claims, 6 Drawing Sheets

F I G. 1
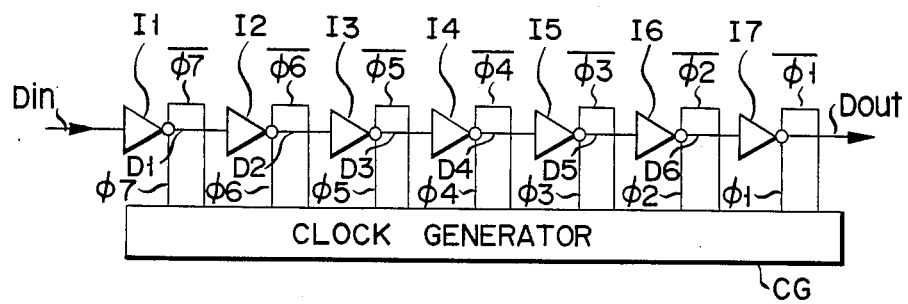
F I G. 5
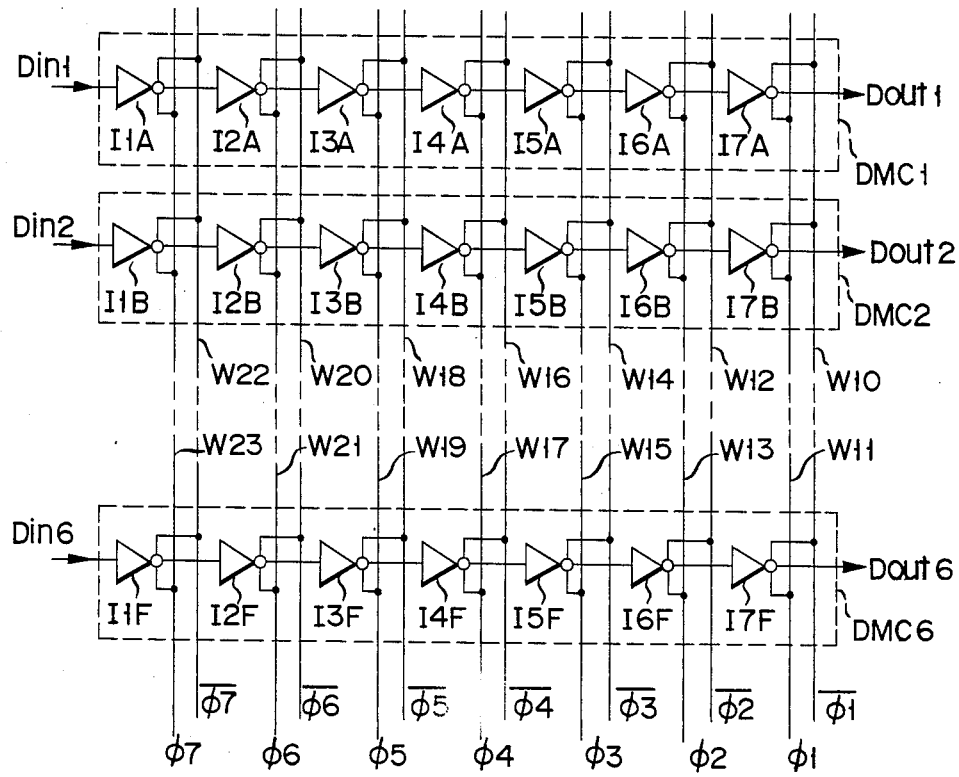

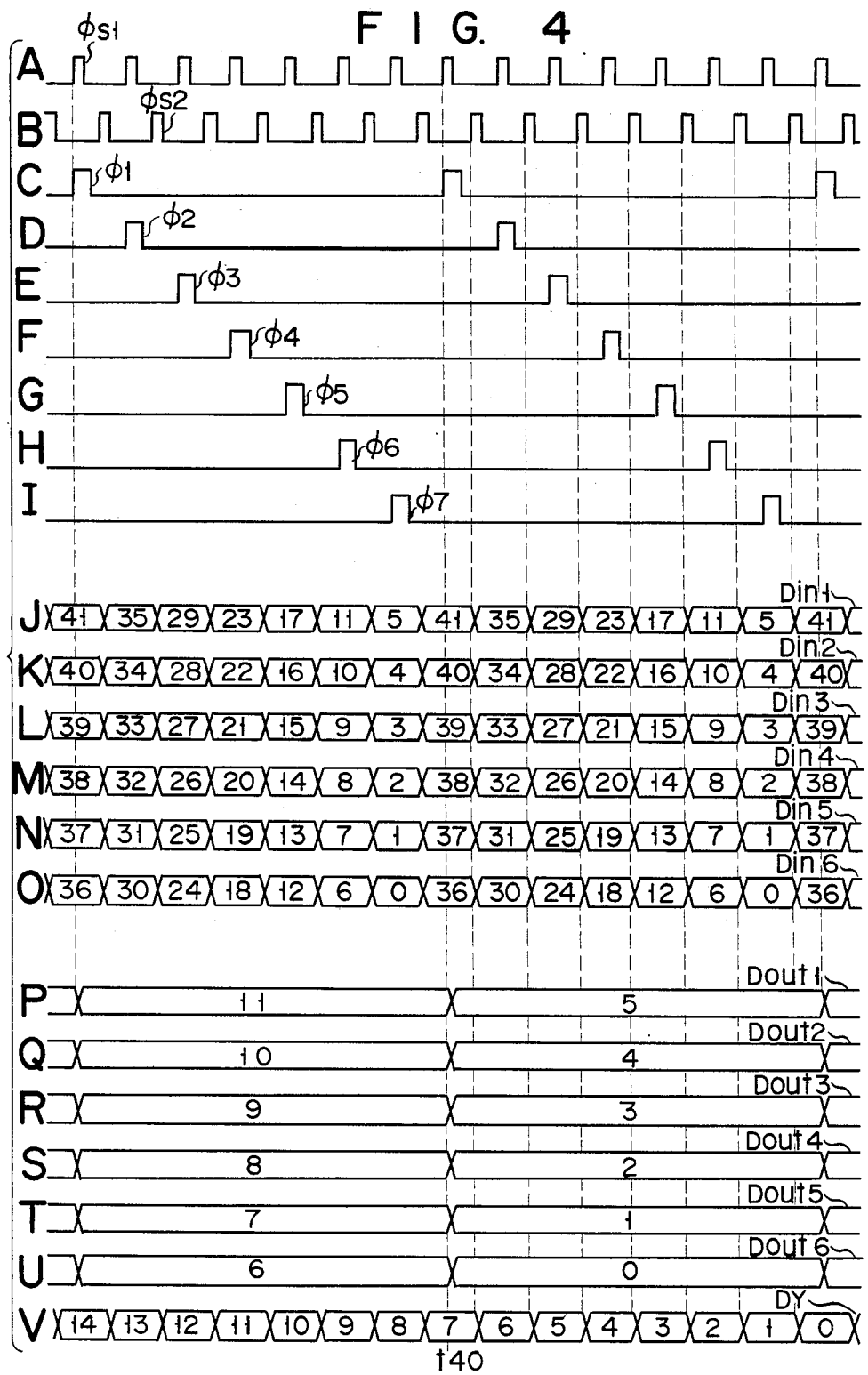

DATA DELAY/MEMORY CIRCUIT

This application is a continuation of application Ser. No. 761,708, filed Aug. 2, 1985, now abandoned.

BACKGROUND OF THE INVENTION

The present invention relates to a data delay/memory circuit which memorizes input data for a given period of time and, thereafter, outputs the memorized data.

Signal processing for temporary memorizing and delaying a digital signal is conventionally effected in a digital 1H memory which delays by one horizontal period of time (1H) a horizontal video signal of a digital TV, in a digital filter, in a deinterleave circuit of a compact disc player, or in the like.

In a prior art data delay/memory circuit used for the above exemplified applications, a plurality of cascade-connected one-bit shift registers are conventionally adapted. The number of the cascade connections depends on the circuit design. Each of these one-bit shift registers comprises a pair of clocked inverters for latching input data. One clocked inverter of the pair operates in synchronism with a clock signal, while the other clocked inverter operates in synchronism with an antiphase clock signal. According to such a prior art data delay/memory circuit, a one bit shift register is inevitably provided for storing each one bit data. Consequently, the necessary number of the data latching, clocked inverters has to be twice the number of the one bit shift registers. If a 1H memory of a digital TV which requires a large memory capacity of, e.g., 1135 bits is constituted by such a data delay/memory circuit, the number of circuit elements becomes numerous. For this reason, when such a data delay/memory circuit is circuit-integrated, a prominently large chip size is required, resulting in a decrease of the yield of IC manufacture while increasing the cost thereof.

SUMMARY OF THE INVENTION

It is, accordingly, an object of the present invention to provide a data delay/memory circuit which allows for a decrease in the necessary number of circuit elements for one bit, thereby reducing the size of the IC chip and improving the yield of IC manufacture.

To achieve the above object, the present invention employs a data shift circuit formed with a plurality of multiply or serially cascade-connected data latch circuits, the plural data latch circuits being controlled by different clock signals. These clock signals have individual clocking phases and are sequentially generated in such a manner that the clocking phase for a final stage of the data latch circuits is ahead of that for an initial stage thereof. According to the present invention, (N+1) data latch circuits satisfactorily constitute an N bit data delay/memory circuit.

According to the present invention, the necessary number of circuit elements per one bit can be effectively decreased, thereby reducing the chip size of the IC and lowering the manufacturing cost.

BRIEF DESCRIPTION OF THE DRAWINGS

FIG. 1 shows a basic configuration of a data delay/memory circuit according to an embodiment of the present invention;

FIGS. 4A to 4V show a timing chart explaining the circuit operation of FIG. 3;

FIG. 5 shows an arrangement of the wiring for feeding clock signals applied to the circuit of FIG. 3;

DETAILED DESCRIPTION OF THE PREFERRED EMBODIMENTS

In the following, preferred embodiments of this invention will be described with reference to the accompanying drawings.

FIG. 1 shows a circuit configuration of a data delay/memory circuit according to one embodiment of the present invention. This circuit is designed to memorize and to delay 6-bit data. In the figure, seven clocked inverters I1 to I7 are multiply or serially cascade-connected. Each of these clocked inverters may be made of a CMOS circuit formed with P-channel and N-channel MOS transistors. The gates of the N-channel MOS transistors receive clock signals $\overline{\phi 1}$ to $\overline{\phi 7}$. The gates of the P-channel MOS transistors receive clock signals $\phi 1$ to $\phi 7$, which are antiphased to clock signals $\overline{\phi 1}$ to $\overline{\phi 7}$, respectively. Clock sgnals $\phi 1$ to $\phi 7$ and $\overline{\phi 1}$ to $\overline{\phi 7}$ are obtained from a clock generator CG. (The generation timing of these clock signals $\phi 1$ to $\phi 7$ and $\overline{\phi 1}$ to $\overline{\phi 7}$ are shown in FIGS. 2A to 2G.)

Input data Din is supplied to the initial stage clocked inerter I1 and, after a certain time delay, the final stage clocked inverter I7 delivers output data Dout corresponding to the input data Din.

As seen from the timing chart of FIGS. 2A to 2G, and from the circuit configuration of FIG. 1, the individual phase delays of clock signals $\phi 1$ to $\phi 7$ (or $\overline{\phi 1}$ to $\overline{\phi 7}$) are gradually increased from the final stage side (I7) toward the initial stage side (I1).

The above clocked inverters I1 to I7, which are controlled by clock signals $\overline{\phi 1}$ to $\overline{\phi 7}$ and by antiphase clock signals $\phi 1$ to $\phi 7$, constitute a dynamic data latch circuit.

Figure 2:
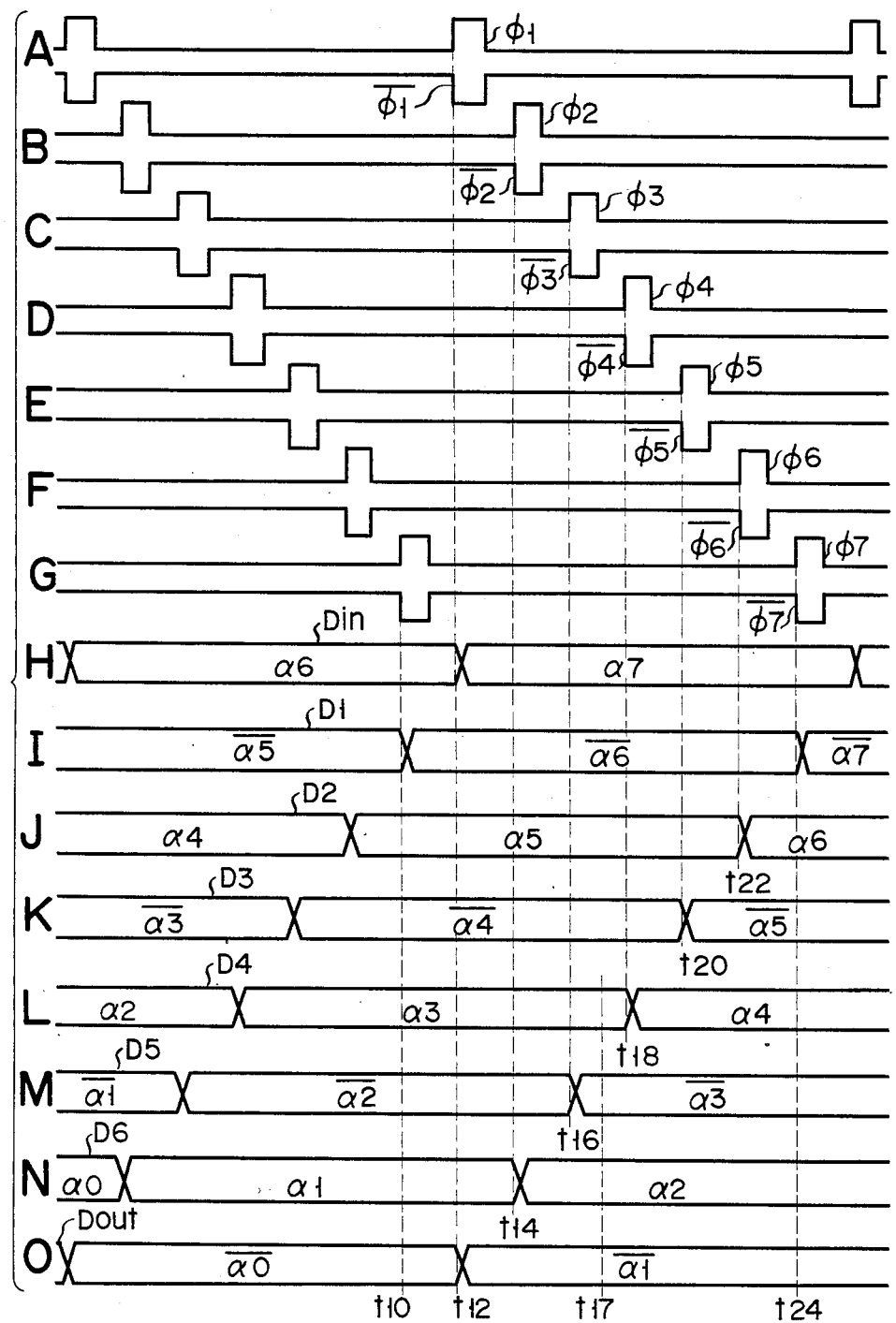
FIGS. 2A to 2O show a timing chart explaining the circuit operation of FIG. 1.

FIGS. 2A to 2O show a timing chart illustrating the clock signals as well as the contents of data latched in the clocked inverters of FIG. 1. The circuit operation of the FIG. 1 embodiment will be described below with reference to this timing chart.

Assume that, immediately after the generation of clock signal $\phi 7$, which is supplied to initial stage clocked inverter I1 at time t10, the contents of data D1, output from initial stage clocked inverter I1 becomes $\overline{a6}$ (after t10 in FIG. 2I). Also assume that output data D2 to D7, from the following clocked inverters I2 to I7, are $a5$, $a4$, $a3$, $\overline{a2}$, $a1$ and $\overline{a0}$, respectively, at time t10 (FIGS. 2J–2O).

According to the FIG. 1 circuit, initial clock signal $\phi 1$, to be generated first, is supplied to clocked inverter I7 which constitutes the final stage of the cascade-connected seven clocked inverters I1 to I7. When clock signal $\phi 1$ is generated under the above assumption (t12 in FIG. 2A), final stage clocked inverter I7 inverts the phase of data D6, that is, output from preceding clocked inverter I6 (from $a1$ to $\overline{a1}$ in FIGS. 2N and 2O). Thus, after the generation of clock signal $\phi1$, the contents of output data Dout from final stage clocked inverter I7 are changed from $\overline{\alpha 0}$ to $\overline{\alpha 1}$ (after T12 in FIG. 2O). Further, when the subsequent clock signal $\phi2$ is generated (t12 in FIG. 2B), clocked inverter I6 is operated so that the phase of data D5, output from clocked inverter I5, is inverted. After generation of clock signal $\phi2$, the contents of data D6, output from clocked inverter I6, are changed from $\alpha1$ to $\alpha2$ (after t14 in FIG. 2N).

Similarly, clocked inverters I5 to I2 are sequentially operated by the subsequent generation of clock signals $\phi3$ to $\phi6$ (FIGS. 2C to 2F), so that the respective outputs from the preceding stages are sequentially phase-inverted. After completion of the generation of these clock signals, the contents of output data D5 to D2 from clocked inverters I5 to I2 are set at $\overline{\alpha 3}$ (after t16 in FIG. 2M), $\alpha4$ (after t18 in FIG. 2L), $\overline{\alpha 5}$ (after t20 in FIG. 2K) and $\alpha6$ (after t22 in FIG. 2J), respectively.

When clock signal $\phi7$ is generated (t24 in FIG. 2G), the initial stage clocked inverter I1 is operated so that the phase of input data Din is inverted (from $\alpha7$ to $\overline{\alpha 7}$ in FIGS. 2H and 2I). After the generation of clock signal $\phi7$, the contents of output data D1, from initial stage clocked inverter I1, are changed from $\overline{\alpha 6}$ to $\overline{\alpha 7}$ (after t24 in FIG. 2I).

During the period of time t10 to t24, seven clocked inverters I1 to I7 store at least 6 bits of data. The minimum bit number 6 of the stored data is obtained when the same data is stored in two clocked inverters. For instance, at time t17, clocked inverter I4 stores data $\alpha3$ (FIG. 2L) which is substantially the same as the data $\alpha3$ (FIG. 2M) stored in clocked inverter I5, except for its phase.

According to the circuit configuration of the above embodiment, storing and delaying of 6 bits of data can be achieved only by seven clocked inverters. When the number of the circuit elements of the present invention is compared with that of the said prior art circuit which would require twelve clocked inverters, five clocked inverters can be saved according to the present invention.

Generally speaking, according to the present invention, (N+1) clocked inverters are satisfactory to achieve the storing and delaying of N bits data. From this, the number of elements required for the circuit integration is considerably reduced when the bit number of the circuit is large. Accordingly, the IC chip size and IC manufacturing cost can also be effectively reduced.

In the above embodiment, many data transferring clock signals $\phi1$ to $\phi7$ are employed. These clock signals may be simply obtained by frequency-dividing a master (or system) clock signal delivered from an oscillator. In this case, the period of these transferring clock signals $\phi1$ to $\phi7$ is longer than that of the master clock signal, and the required data transfer rate can be lowered beyond that required when the data transfer is carried out with the master clock signal in conjunction with its phase-inverted signal, this being one of the advantages obtained by the configuration of FIG. 1.

Figure 3:
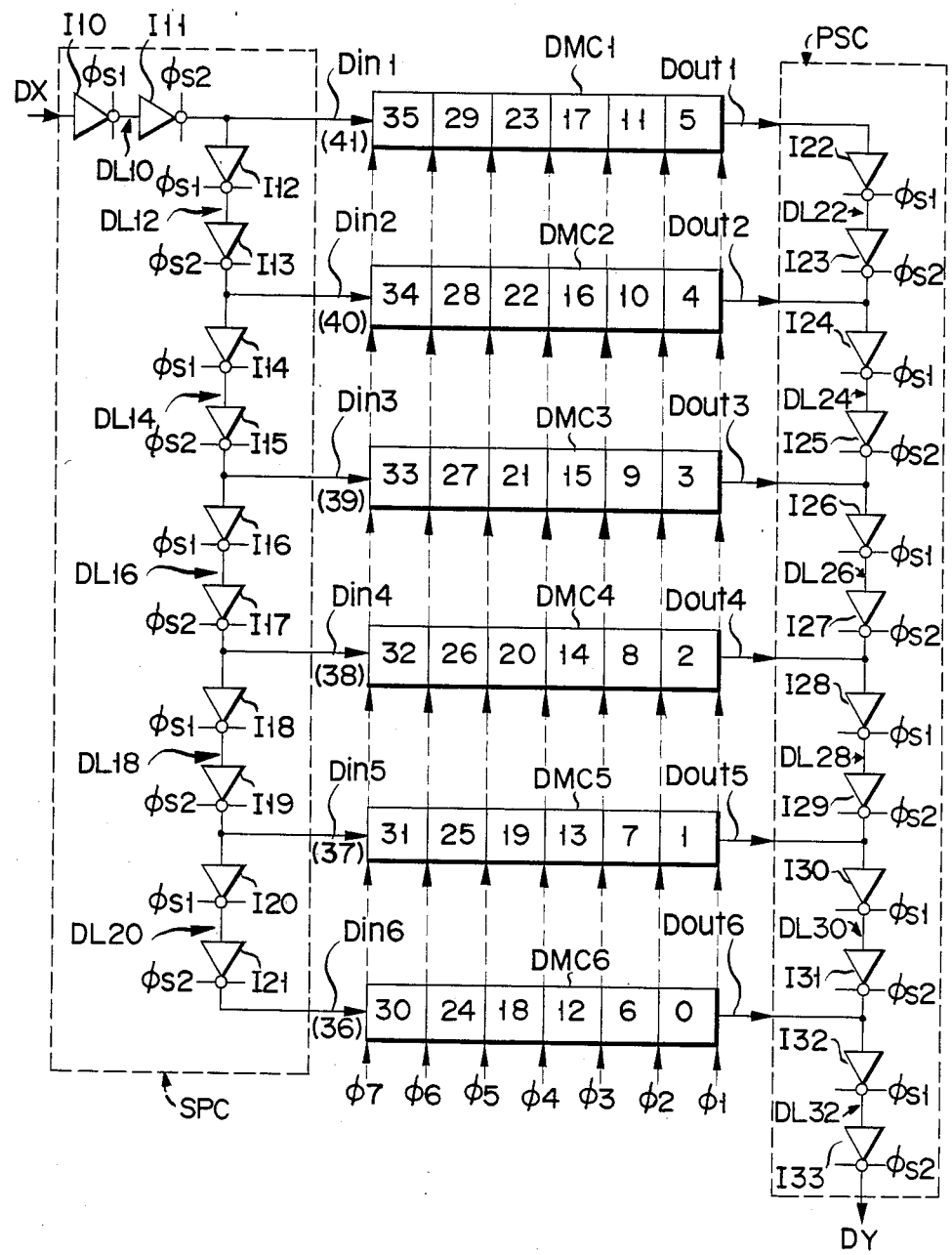
FIG. 3 shows a circuit configuration of one application of the FIG. 1 circuit.

FIG. 3 shows a circuit configuration of a typical application of the present invention. According to this circuit application, a high data transferring rate based on master clocks ($\phi s1$, $\phi s2$) can be obtained while enjoying the advantage (reduction in the required number of the circuit elements) of this invention.

According to a data delay/memory circuit of this application, six data dela/memory circuits, DMC1 to DMC6, each of which may have the same configuration as FIG. 1, are parallel arranged, thereby achieving 6 bits data storing and delaying.

The data input side of DMC1 to DMC6 is coupled to a data series/parallel converter circuit SPC. Converter SPC includes 6 sets of cascade-connected data delay circuits DL10 to DL20. Circuits DL10 to DL20 are respectively formed with CMOS clocked inverter pairs I10 to I21, each pair of which is controlled by dual-phase master clock signals $\phi s1$ and $\phi s2$. The data output sides of DMC1 to DMC6 are coupled to a data parallel/serial converter circuit PSC. Converter PSC includes 6 sets of cascade-connected data delay circuits DL22 to DL32. Circuits DL22 to DL32 are respectively formed with CMOS clocked inverter pairs I22 to I33, each pair of which is controlled by dual-phase master clock signals of $\phi s1$ and $\phi s2$. Respective outputs Din1 to Din 6, from data delay circuits DL10 to DL20, in SPC are supplied to DMC1 to DMC6. Respective delayed output data Dout1 to Dout6, from DMC1 to DMC6, are supplied to the corresponding data delay circuits DL22 to DL32 in PSC.

The above converter circuit SPC distributes to DMC1 to DMC6 the serial data (numbered by 0–41) supplied to the initial stage (DL10) of data delay circuits, in accordance with the dual-phase master clock signals $\phi s1$ and $\phi s2$. Conversely, converter circuit PSC progressively delays output data Dout1 to Dout6 for each one bit of the data delay circuits in synchronism with the dual-phase master clock signals $\phi s1$ and $\phi s2$, so that the delayed parallel data Dout1 to Dout6 are sequentially converted into serial data and transferred to the circuit end (I33) of PSC. Data Dout1 to Dout6 are obtained by the distributing operation of SPC and are stored and delayed in parallel by DMC1 to DMC6.

FIGS. 4A to 4V comprise a timing chart explaining the circuit operation of FIG. 3.

Assume a case wherein 41st to 36th data, as shown at time t40 in FIGS. 4J to 4O, are supplied to DMC1 to DMC6 as input data Din1 to Din6. Assume further that DMC1 to DMC6 respectively store individual data numbered as shown in FIG. 3. In this case, the respective contents of parallel output data Dout1 to Dout6, from DMC1 to DMC6, become 5th to 0th data as shown in FIGS. 4P to 4V.

Output data Dout1 to Dout6, from DMC1 to DMC6, are sequentially transferred via respective data delay circuits DL22 to DL32, operated in synchronism with master clock signals $\phi s1$ and $\phi s2$. Then, final output data DY which is synchronized with master clock signals $\phi s1$ and $\phi s2$ is delivered from the circuit end of PSC. Thus, the rate of data transfer can be made substantially the same as the master clocking rate, according to the circuit configuration of FIG. 3. In addition, according to this circuit arrangement, only 66 circuit elements (42 elements for DMC1 to DMC6, 12 elements for SPC, and 12 elements for PSC) are necessary to constitute a 36 bits data delay/memory circuit (which is formed with 6 bits×6 DMC blocks). In contrast, according to a prior art circuit depending on master clock signals alone, 72 circuit elements (=36 bits×2) are required. Thus, 6 circuit elements can be saved according this embodiment, the number of saved circuit elements being much increased as the number of bits becomes large.

FIG. 5 shows a wiring arrangement for clock signals when DMC1 to DMC6 in the embodiment of FIG. 3 are arranged in parallel in the IC. As may be seen from FIG. 5, wirings W10 to W23, for feeding respective clock signals ($\phi1$-$\phi7$ and $\overline{\phi1}$-$\overline{\phi7}$), are arranged perpendicular to the data transferring direction (horizontal in the figure) of seven cascade-connected clocked inverters I1A to I7A. When such a wiring arrangement is employed, the total area of the wiring pattern is smaller than that where respective data delay/memory circuits utilize individual wirings which are parallel along the data transferring direction of clocked inverters I1A to I7A.

Figure 6:
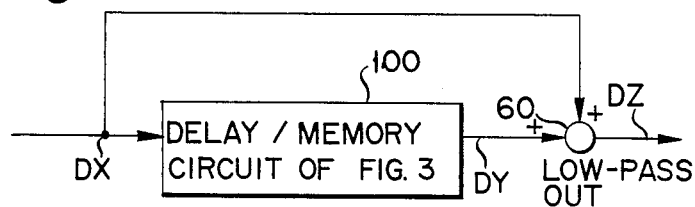
FIG. 6 shows a digital low-pass filter utilizing the circuit of FIG. 3.

FIG. 6 shows a digital low-pass filter utilizing the circuit of FIG. 3. A digital input signal DX is supplied to a data delay/memory circuit 100 which may have the circuit configuration of FIG. 3. Input signal DX may be obtained by A/D converting an analog voice signal, video signal, or the like. A digital output signal DY is supplied to an adder 60. Input signal DX is added to output signal DY in adder 60. An output signal DZ from adder 60 has an amplitude component double that of input signal DX. Prescribed high frequency components of signal DZ are filtered off by the circuit operation of FIG. 6.

Figure 7:
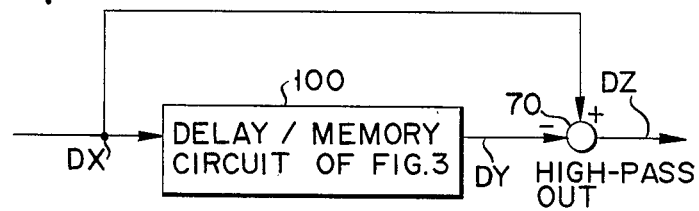
FIG. 7 shows a digital high-pass filter utilizing the circuit of FIG. 3.

FIG. 7 shows a digital high-pass filter utilizing the circuit of FIG. 3. Digital input signal DX is supplied to data delay/memory circuit 100 having the circuit configuration of FIG. 3. Input signal DX may be obtained by A/D converting an analog video signal or the like. When input signal DX is a video signal, the delay time of the FIG. 3 circuit is selected to be one horizontal scanning period (1H) of a TV system. Digital output signal DY is supplied to the negative input of a subtracter 70. Input signal DX is supplied to the positive input of subtracter 70. Output signal DZ from subtracter 70 corresponds to DX - DY. Prescribed low frequency components of signal DZ are filtered off by the circuit operation of FIG. 7.

Figure 8:
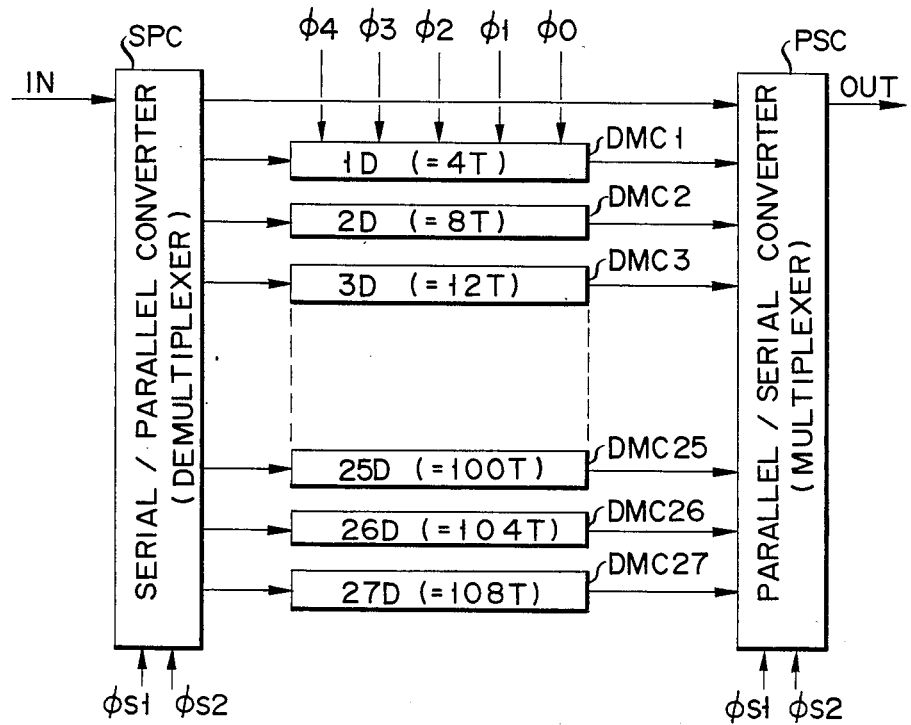
FIG. 8 shows a deinterleave circuit for a CD (compact disc) to which the circuit of FIG. 3 is applied.
Figure 9:
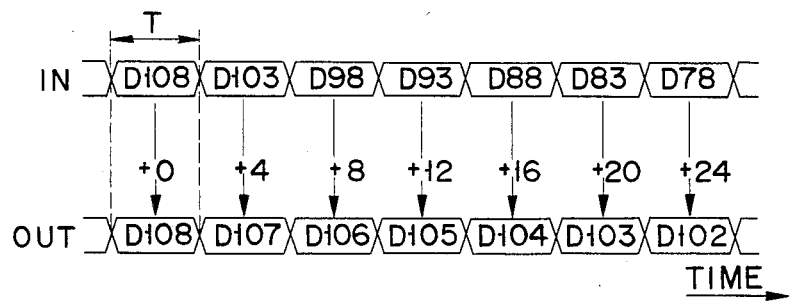
FIG. 9 is a timing chart partially showing the relation between input data and output data.

FIG. 8 shows a deinterleave circuit for a CD (compact disc) to which the circuit of FIG. 3 is applied. FIG. 9 is a timing chart showing the relation between input data IN and output data OUT of the FIG. 8 circuit. In this deinterleave circuit, a delay time D is assumed to be 4T, where T denotes a period of each of the data of the CD. Since D=4T, five clock signals $\phi0$ to $\phi4$ are provided. Each of these clock signals $\phi0$ to $\phi4$ has an individual phase, as in the case of the FIG. 3 embodiment (cf. FIGS. 4C-4G), and is supplied to data delay/memory circuits DMC1 to DMC27. According to the circuit operation of FIG. 8, interleaved data IN is interleaved as shown in FIG. 9.

Figure 10A:
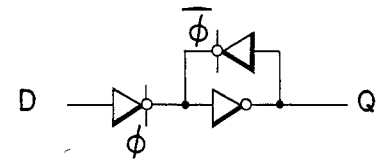
FIGS. 10A to 10E respectively show modifications of each of the latch circuits I1 to I7) in FIG. 1.
Figure 10B:
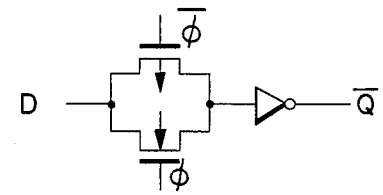
Figure 10C:
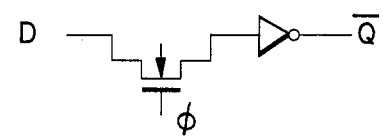
Figure 10D:
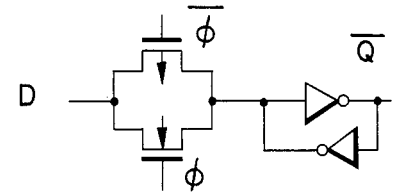
Figure 10E:
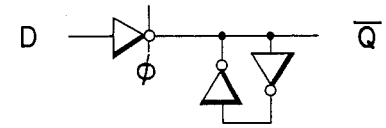

FIGS. 10A to 10E, respectively, show modifications of each of latch circuits I1 to I7 in FIG. 1. The latch circuits of FIG. 1 are dynamic clocked inverters. In contrast, the latch circuit of FIG. 10A is a static latch formed of a clocked inverter. The latch circuit of FIG. 10B is a dynamic latch formed of a transmission gate being formed with P and N channel MOS transistors. The latch circuit of FIG. 10C is a dynamic latch formed of a transmission gate being formed with an N channel MOS transistor. The latch circuit of FIG. 10D is a static latch formed of a transmission gate being formed with P and N channel MOS transistors. Tha latch circuit of FIG. 10E shows another static latch formed of a clocked inverter.

The present invention should not be limited to the above-mentioned embodiments, various modifications can be made thereof. Although the circuit of FIG. 3 employs six data delay/memory circuits DMC1 to DMC6 arranged in parallel with each storing and delaying 6 bits of data, the number of bits of each DMC1 to DMC6 may differ from the number of the parallel arranged data delay/memory circuits. For instance, twelve data delay/memory circuits, each of which stores and delays 6 bits of data, may be parallel arranged. In this case, the period of clock signals used for controlling the clocked inverters of the respective data delay/memory circuits becomes double the period needed when six data delay/memory circuits are parallel arranged, thereby increasing the margin of circuit operation. If the above circuits are circuit-integrated and the design center of an operation speed is set at low, small size circuit elements can be used in the IC. For this, reduction in both the size of the IC chip and the cost of IC manufacturing can be achieved.

What is claimed is:

1. A data delay/memory circuit for an integrated circuit (IC) comprising:

a plurality of data shift circuits, each formed of a plurality of clock-controlled data latch circuits which are cascade-connected in a data transfer direction from an initial stage data latch circuit to a final stage data latch circuit, said data shift circuits being arranged in parallel in the IC and parallel to the data transfer direction; and means for supplying each of the plurality of data latch circuits of each of said data shift circuits with clock signals having more than four different individual clocked phases and being sequentially generated for providing the clocking phase for each of the final stage data latch circuits to said final stage before the clocking phase for each of the initial stage data latch circuits, said supplying means including wirings, formed in said IC across the data transfer direction, for feeding said clock signals to said data latch circuits.

2. A data delay/memory circuit according to claim 1 wherein each of said data latch circuits includes a clocked inverter.

3. A digital data delay/memory circuit comprising:

a plurality of data delay/memory circuits each being formed of at least three clock-controlled and cascade-connected data latch circuits, each of which data latch circuits stores and outputs digital data, one of which data latch circuits constitutes an initial stage of the respective data delay/memory circuit and the input of said one data latch circuit is the input terminal of the respective data delay/memory circuit, and another of which data latch circuits, coupled to said one data latch circuit via remaining data latch circuits, constitutes a final stage of the respective data delay/memory circuit and the output of said another data latch circuit is the output terminal of the respective data delay/memory circuit;

means for supplying each of said plurality of data latch circuits with clock signals having more than four different individual clocking phases and being sequentially generated for providing the clocking phase for the final stage of each of said data delay/memory circuits to said final stage before the clocking phase for the initial stage of each of said data delay/memory circuits, all said data latch circuits being continuously clocked by said clock signals in the order from said final stage through said initial stage of said data delay/memory circuits;

serial/parallel converter means, coupled to the input terminals of said data delay/memory circuits and responsive to digital data delay/memory circuit serial input data, for supplying the respective input terminals of said data delay/memory circuits with first data, the first data for each of said respective input terminals having a different phase with respect to said serial input data; and parallel/serial converter means, coupled to the output terminals of said data delay/memory circuits, for converting second data delivered from the respective output terminals of said data delay/memory circuits into digital delay data/memory circuit serial output data.

4. A data delay/memory circuit according to claim 3, wherein each of said serial/parallel converter means and said parallel/serial converter means is controlled by a master clock signal and formed of a plurality of cascade-connected data delay circuits.

5. A data delay/memory circuit according to claim 3, wherein each delay time of the respective signals in said plural data delay/memory circuits, which are associated with said serial/parallel converter means and said parallel/serial converter means, is set at a prescribed length of time.

* * * * *